(12) United States Patent
Yamada

(10) Patent No.: US 9,112,016 B2
(45) Date of Patent: *Aug. 18, 2015

(54) SEMICONDUCTOR DEVICE AND METHOD OF FABRICATING THE SAME

(71) Applicant: Kabushiki Kaisha Toshiba, Tokyo (JP)

(72) Inventor: Tsubasa Yamada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 13/954,718

(22) Filed: Jul. 30, 2013

(65) Prior Publication Data

US 2014/0035031 A1 Feb. 6, 2014

Related U.S. Application Data

(62) Division of application No. 13/050,404, filed on Mar. 17, 2011, now Pat. No. 8,530,942.

(30) Foreign Application Priority Data

Nov. 9, 2010 (JP) .................................. 2010-250536

(51) Int. Cl.
*H01L 29/786* (2006.01)
*H01L 29/78* (2006.01)
*H01L 29/66* (2006.01)
(Continued)

(52) U.S. Cl.
CPC ............ *H01L 29/78* (2013.01); *H01L 29/0692* (2013.01); *H01L 29/1087* (2013.01); *H01L 29/66515* (2013.01); *H01L 29/66659* (2013.01); *H01L 29/7835* (2013.01); *H01L 29/0653* (2013.01); *H01L 29/1045* (2013.01)

(58) Field of Classification Search
CPC ............ H01L 29/1045; H01L 29/1095; H01L 29/66681; H01L 27/102; H01L 27/105
See application file for complete search history.

(56) References Cited

U.S. PATENT DOCUMENTS 6,707,104 B2   3/2004  Watanabe et al.
2002/0079514 A1*  6/2002  Hower et al. ............... 257/200
(Continued)

FOREIGN PATENT DOCUMENTS

JP   H07307401 A    11/1995
JP   2007-258283    *  4/2007
(Continued)

OTHER PUBLICATIONS

Translated JP2007-258283 document.*
(Continued)

*Primary Examiner* — Su C Kim
(74) *Attorney, Agent, or Firm* — Patterson & Sheridan, LLP

(57) ABSTRACT

According to one embodiment, a semiconductor device, including a semiconductor layer including a first region and a second region isolated from the first region, a source in a surface of the first region, a drain in a surface of the second region, a back-gate in the surface of the source, a gate insulator on a surface of the first region, an end of a drain side of the back-gate being located closer to the drain side than an end of the drain side of the source, a gate insulator on a surface of the semiconductor layer between the first region and the second region, a gate electrode on the gate insulator, a source electrode being contacted to both the source and the back-gate, and a drain electrode being contacted to the drain area.

18 Claims, 10 Drawing Sheets

(51) Int. Cl.
　　*H01L 29/06*　　(2006.01)
　　*H01L 29/10*　　(2006.01)

(56) References Cited

U.S. PATENT DOCUMENTS

| | | |
|---|---|---|
| 2009/0283832 A1 | 11/2009 | Sugiura |
| 2010/0301411 A1 | 12/2010 | Takeda et al. |
| 2011/0108915 A1 | 5/2011 | Nakamura et al. |
| 2012/0007140 A1 | 1/2012 | Vashchenko |
| 2012/0074492 A1 | 3/2012 | Yu et al. |

FOREIGN PATENT DOCUMENTS

| | | |
|---|---|---|
| JP | 2007258283 A | 10/2007 |
| JP | 2008181934 A | 8/2008 |

OTHER PUBLICATIONS

Japanese Office Action dated Jan. 16, 2014, filed in Japanese counterpart Application No. 2010-250536, 6 pages (with translation).

* cited by examiner

SEMICONDUCTOR DEVICE AND METHOD OF FABRICATING THE SAME

CROSS REFERENCE TO RELATED APPLICATION

This application is a divisional of U.S. patent application Ser. No. 13/050,404, filed on Mar. 17, 2011, which is based upon and claims the benefit of priority from prior Japanese Patent Application No. 2010-250536, filed on Nov. 9, 2010, the entire contents of which are incorporated herein by reference.

FIELD

Exemplary embodiments described herein generally relate to a semiconductor device and a method of fabricating the semiconductor device.

BACKGROUND

In a power device with a lateral metal-oxide-semiconductor (MOS) transistor structure, a lateral parasitic bipolar transistor using a drain as a collector, a body area as a base, and a source as an emitter is likely to turn on when a hole current increases due to avalanche breakdown.

When the lateral parasitic bipolar transistor turns on, the MOS transistor cannot be controlled by using a gate, so that the MOS transistor is broken down.

DETAILED DESCRIPTION

Figure 1:
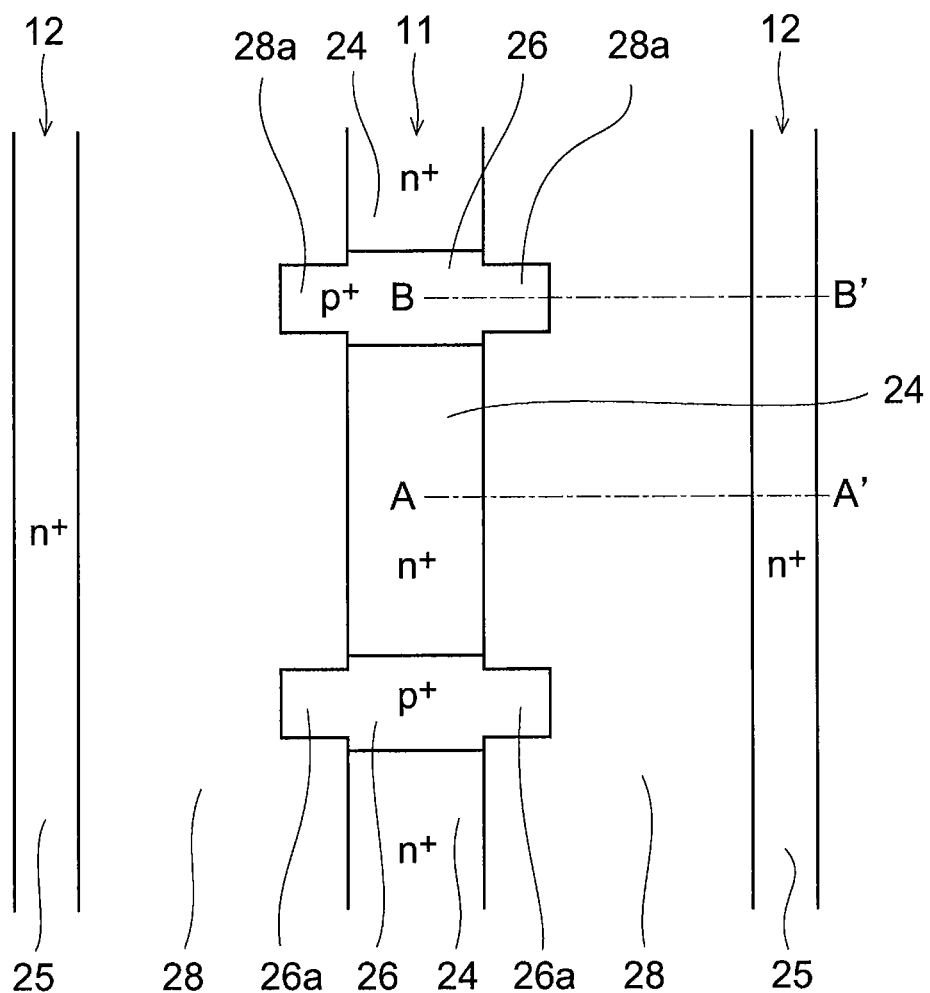
FIG. 1 is a schematic plan view showing a semiconductor device according to a first embodiment.

According to one embodiment, a semiconductor device, including a semiconductor layer comprising a first region and a second region isolated from the first region, a source area with a first conductivity type provided in a surface of the first region, a drain area of the first conductivity type provided in a surface of the second region, a back-gate area with a second conductivity type provided in the surface of the first region, an end of a drain area side of the back-gate area being located closer to the drain area side than an end of the drain area side of the source area, a gate insulator on a surface of the semiconductor layer between the first region and the second region, a gate electrode on the gate insulator, a source electrode being contacted to both the source area and the back-gate area, and a drain electrode being contacted to the drain area.

Hereinafter, embodiments will be described with reference to the drawings.

Note that the same elements are denoted by the same reference numerals in the drawings.

The embodiments described below will be described with a first conductivity type defined as an n-type, and with a second conductivity type defined as a p-type. However, the first conductivity type may be the p-type, and the second conductivity type may be the n-type. Moreover, silicon is used as a semiconductor. Alternatively, semiconductors other than silicone (compound semiconductors such as SiC and GaN, for example) may be used.

First Embodiment

Figure 2A:
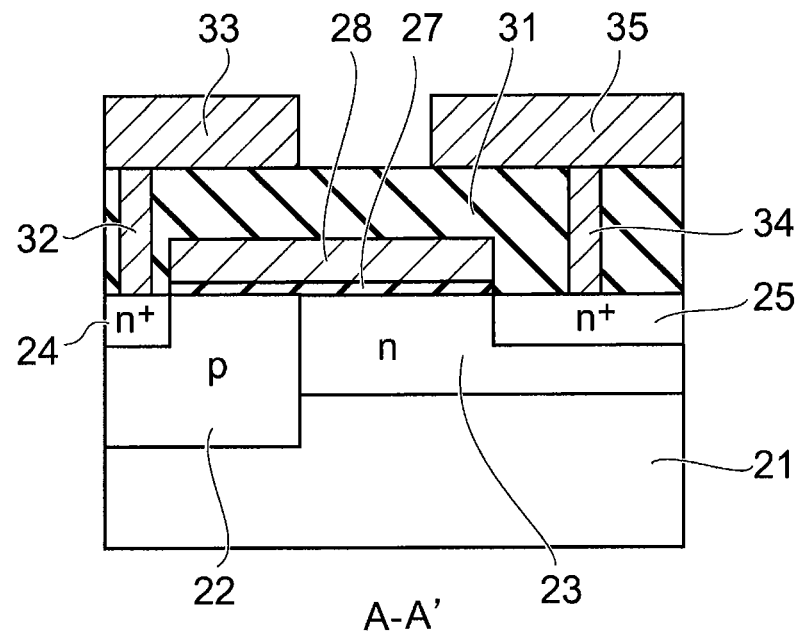
FIG. 2A is a cross-sectional view showing the semiconductor device taken along the A-A' line of FIG. 1.

FIG. 1 is a schematic plan view showing a semiconductor device according to a first embodiment, and shows a plan layout of the semiconductor device having a drain area 25, a source area 24, a back-gate area 26, and a gate electrode 28. FIG. 2A is a cross-sectional view showing the semiconductor device taken along the A-A' line of FIG. 1, and FIG. 2B is a cross-sectional view showing the semiconductor device taken along the B-B' line of FIG. 1.

Figure 2B:
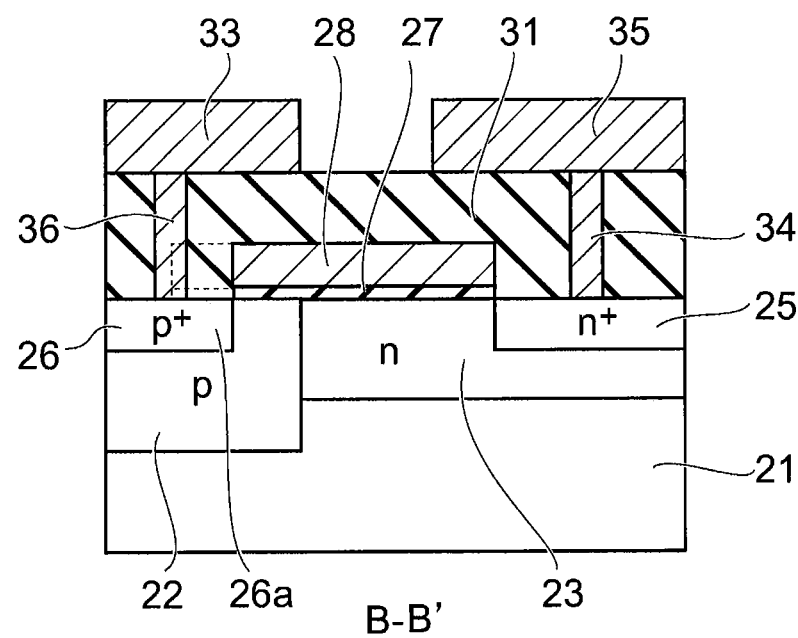
FIG. 2B is a cross-sectional view of the semiconductor device taken along the B-B' line of FIG. 1 according to the first embodiment.

As shown in FIGS. 2A and 2B, the semiconductor device of the embodiment has a semiconductor layer including a p-type body area 22 and an n-type drift area 23. The body area 22 and the drift area 23 are provided on a top surface-side portion of a p-type substrate 21. The body area 22 and the drift area 23 are contacted each other under the gate electrode 28. Instead, the body area 22 and the drift area 23 may not have to be contacted each other.

The $n^+$-type source area 24 and the $p^+$-type back-gate area 26 are provided on a top surface of the body area 22. The $n^+$-type drain area 25 is provided on a top surface of the drift area 23. The drain area 25 has a higher n-type impurity concentration than the drift area 23. The back-gate area 26 has a higher p-type impurity concentration than the body area 22.

Moreover, as shown in the plan view of FIG. 1, the semiconductor layer of the embodiment includes a first region 11 and a second region 12 which are isolated from each other with the gate electrode 28 interposed in between. The source area 24 and the back-gate area 26 are provided in the first region 11. The drain area 25 is provided in the second region 12, respectively.

The gate electrodes 28 is provided on a top surface of the semiconductor layer between the first region 11 and the second region 12 via a gate insulator 27 interposed in between. The body area 22 and the drift 23 exist below the gate electrode 28 via the gate insulator 27 interposed in between.

As shown in FIG. 2A, the body area 22 exists between the source 24 and the drift 23. As shown in FIG. 2B, the body area 22 exists between the back-gate area 26 and the drift area 23. As shown in FIGS. 2A and 2B, the drift area 23 exists between the body area 22 and the drain area 25.

In this respect, a gate length direction is defined as a direction (horizontal direction in FIG. 1) in which the first region 11 and the second region 12 are connected each other, and in which a main current flows while the gate is on. A gate width direction is defined as a direction (vertical direction in FIG. 1) which is orthogonal to the gate length direction.

The source area 24 and the back-gate area 26 are laid out alternately in the gate width direction. The back-gate 26 area has protrusion areas 26a each of which protrudes toward the corresponding drain area 25 beyond the source area 24 in the plan view of FIG. 1. In other words, an end of the drain area side of the back-gate area 26 is located closer to the drain area 25 than an end of the drain area side of the source area 24. The length of the back-gate 26 area is longer in the gate length direction than in the gate width direction.

The gate electrode 28 has a planar pattern in which a portion of the gate electrode 28 is cut out above the protrusion area 26a of the back-gate area 26. In other words, the portion of the gate electrode 28 which are closer to the first region 11 is recessed with an opening like a concave shape directed toward the first region 11.

Each of the protrusion areas 26a of the back-gate 26 is formed under a recess portion 28a of the gate electrode 28. The length of a portion of the gate electrode 28 is shorter between the back-gate area 26 and the drain area 25 than between the source area 24 and the drain area 25.

As shown in FIGS. 2A and 2B, an interlayer insulator 31 is provided on a top surface of the semiconductor layer in which the semiconductor areas described above are formed, the interlayer insulator 31 covering the gate electrode 28. A source electrode 33 and a drain electrode 35 are provided on a top surface of the interlayer insulator 31. The source electrode 33 and the drain electrode 35 are dielectrically isolated from each other by an insulating layer, which is not illustrated.

A source contact electrode 32 which penetrates the interlayer insulator 31 and reaches the source area 24 is formed under the source electrode 33. The source electrode 33 is electrically connected to the source area 24 via the source contact electrode 32.

Moreover, the source electrode 33 is provided on the back-gate area 26 via the interlayer insulator 31 interposed in between as well. A back-gate contact electrode 36 which penetrates the interlayer insulator 31 and reaches the back-gate area 26 is formed under the source electrode 33. The back-gate area 26 is electrically connected to the source electrode 33 via the back-gate contact electrode 36.

A drain contact electrode 34 which penetrates the interlayer insulator 31 and reaches the drain area 25 is formed under the drain electrode 33. The drain electrode 35 is electrically connected to the drain area 25 via the drain contact electrode 34.

When a desired gate potential is applied to the gate electrode 28 with relatively high and low potentials respectively applied to the drain electrode 35 and the source electrode 33, an inversion layer (n-channel) is formed in the top surface-side portion of the body area 22 below the gate electrode 28. For example, a ground potential or a negative potential is applied to the source electrode 33, and a positive gate potential is applied to the gate electrode 28. A positive potential higher than the gate potential is applied to the drain electrode 35.

Accordingly, electric current flows between the source electrode 33 and the drain electrode 35 via the source area 24, the n-channel, the drift area 23, and the drain area 25, as well as the semiconductor device is turned on. A threshold voltage is adjusted by controlling the impurity concentration of the body area 22.

The semiconductor device of the embodiment has a double diffusion metal-oxide-semiconductor (DMOS) structure in which a channel of the MOS transistor is formed by double diffusion to achieve a higher breakdown voltage. In other words, the drift area 23 with a relatively low n-type impurity concentration is provided. Thus, when the gate is off, the drift area 23 is depleted and electric field is relaxed. Hence, the higher breakdown voltage is achieved. A desired breakdown voltage can be achieved by adjusting the n-type impurity concentration of the drift area 23 and the length of the drift area 23 in a horizontal direction.

Moreover, when an avalanche breakdown occurs, hole current flows to the source electrode 33 via the back-gate 26 and the back-gate contact electrode 36. Accordingly, break down of the element is prevented.

In a general DMOS, an impurity concentration is lower and a resistance is higher in a body area than in a back-gate area. Thus, as the back-gate area becomes further from a boundary between a body area and adrift area, a p-n junction between a base area and an emitter area of a parasitic bipolar transistor which has a drain area as a collector, the body area as a base, and a source area as the emitter becomes more likely to be biased in a forward direction. Thus, a parasitic bipolar transistor is more likely to operate.

When the gate is off, the electric field becomes likely to be higher especially at a portion which is below the gate electrode 28 and is on the drain area side. The avalanche breakdown is likely to occur in the portion.

The back-gate area 26 is provided protruding toward the drain area 25 beyond the source area 24 in the embodiment. In other words, the back-gate area 26 is closer to an avalanche breakdown point than the sources area 24.

Thus, an avalanche current (hole current) is easy to flow to the source electrode 33 via the back-gate area 26. Hence, a base resistance of the parasitic bipolar transistor is reduced, and the parasitic bipolar transistor is less likely to turn on. As a result, the amount of the breakdown voltage is improved.

When the amount of breakdown voltage is improved, the area ratio of the back-gate 26 can be reduced, and the element area can be reduced.

The length of the back-gate area 26 is longer in the gate length direction than in the gate width direction. Thus, the amount of breakdown voltage can be improved while inhibiting the reduction in the area of the source area 24 and thereby suppressing the increase in on-resistance.

Figure 3A:
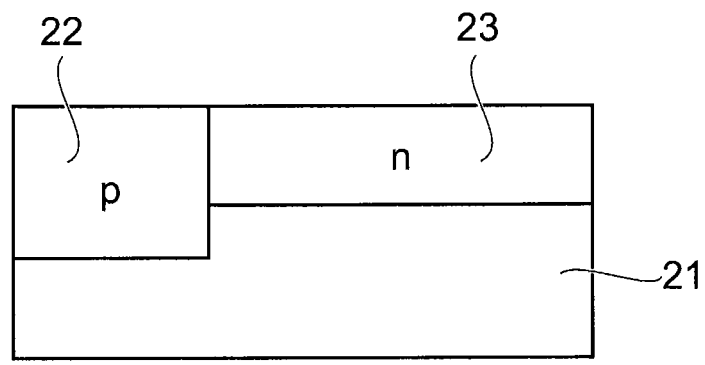
FIG. 3A and FIG. 3B are schematic cross-sectional views showing a method of fabricating the semiconductor device according to the first embodiment.

Next, a method of fabricating the semiconductor device of the first embodiment will be described with reference to FIGS. 3 to 5. Note that FIGS. 3A to 4B correspond to the B-B' cross section of FIG. 1.

Firstly, a p-type impurity and an n-type impurity are implanted into the substrate 21 by ion implantation by using a mask, for example, which is not illustrated. A heat treatment is performed after ion implantation, and thus the p-type body area 22 and the n-type drift area 23 are formed as shown in FIG. 3A.

Figure 3B:
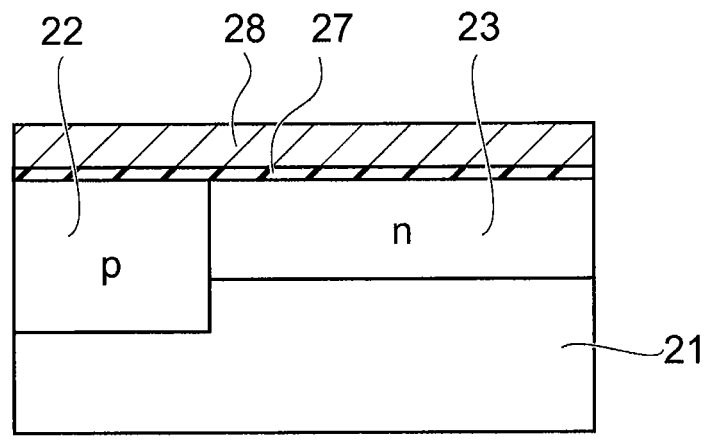
Figure 4A:
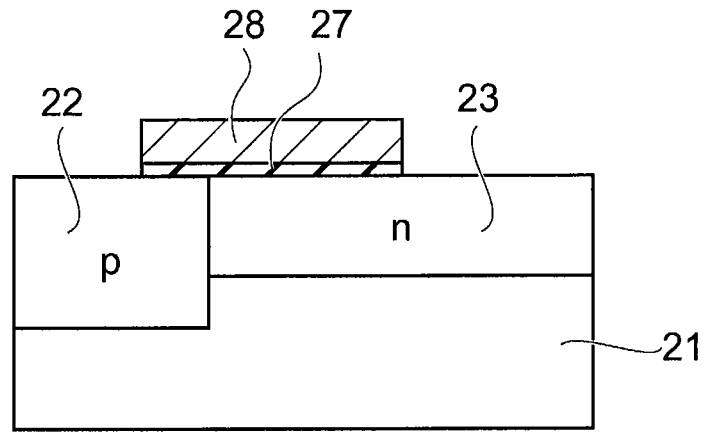
FIG. 4A and FIG. 4B are schematic cross-sectional views showing the method of fabricating the semiconductor device according to the first embodiment.

Next, as shown in FIG. 3B, the gate insulator 27 is formed on the top surface of the semiconductor layer including the body area 22 and the drift area 23. The gate electrode 28 is formed on the gate insulator 27. Thereafter, the gate electrode 28 and the gate insulator 27 are patterned as shown in FIG. 4A.

For example, a resist mask formed on the gate electrode is selectively exposed to light and developed, and a resist pattern is thus formed. Then, the gate electrode 28 is selectively etched by using the resist pattern as a mask.

The gate electrode 28 is patterned to have a planar shape partially having recess portions 28a, as shown in FIG. 1.

Figure 4B:
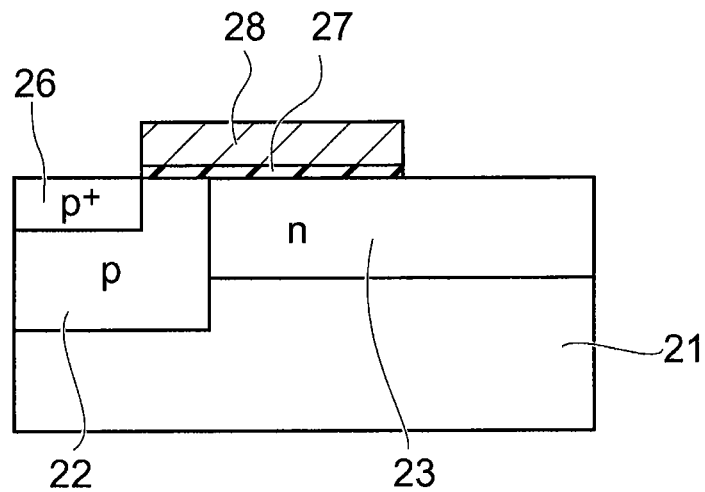

After the gate electrode 28 is patterned, the back-gate 26 area is formed on a top surface of the body area 22, as shown in FIG. 4B.

Figure 5:
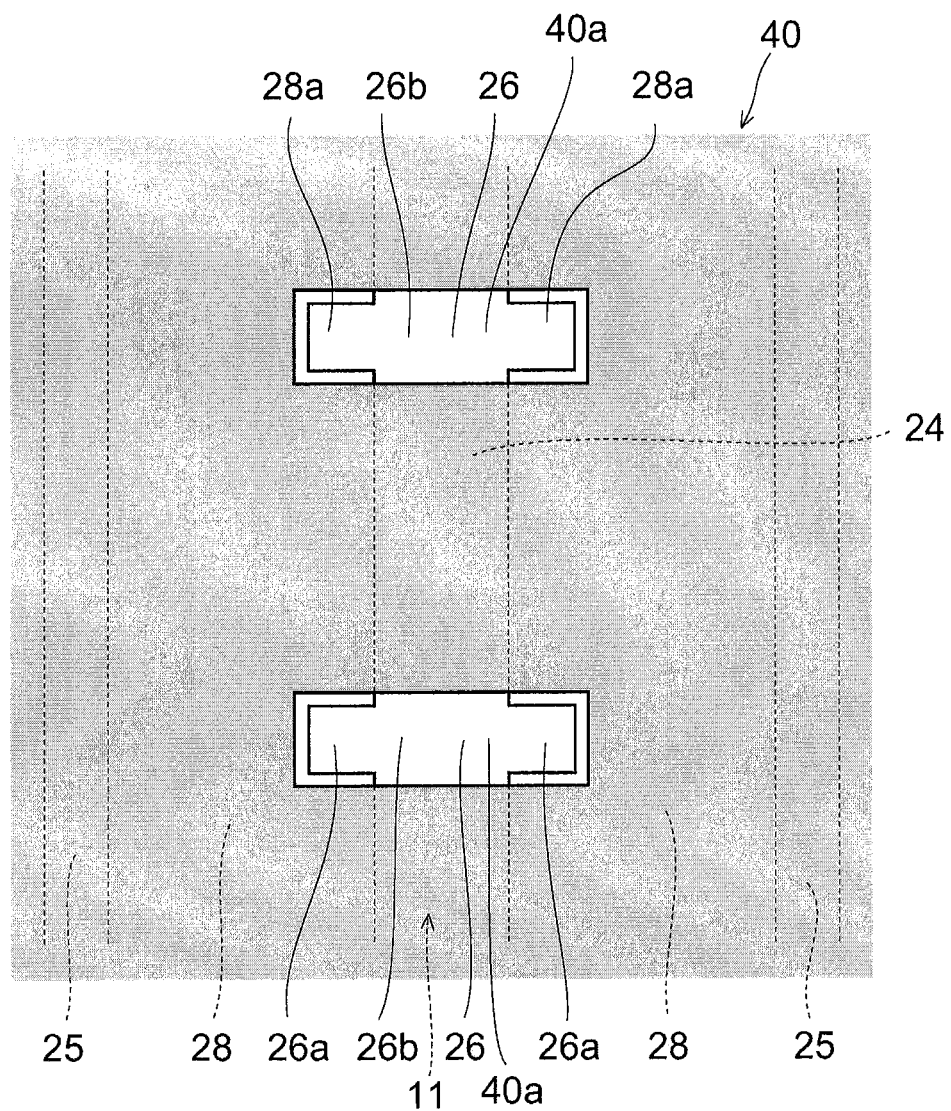
FIG. 5 is a schematic cross-sectional view showing the method of fabricating the semiconductor device according to the first embodiment.

For example, a p-type impurity is introduced by ion implantation using a mask 40 shown in FIG. 5. Mask openings 40a are formed in the mask 40. The recess portion 28a of the gate electrodes 28 are exposed through the mask opening 40a. In addition, portion of the first region 11 beside the recess portion 28a are also exposed through the mask opening 40a. The mask 40 covers regions where to form source area 24 and regions where to form drain area 25.

After the p-type impurity is implanted into the region exposed through the mask opening 40a, a heat treatment is performed. Thus, the back-gate area 26 including the protrusion area 26a protruding toward the drain area 25 is formed.

The protrusion area 26a of the back-gate area 26 which protrude toward the drain area 25 can be formed in a self-aligning manner by forming the recess portion 28a during the patterning of the gate electrode 28, and then performing ion implantation after the patterning of the gate electrode 28.

The source area 24 and the drain area 25 which are both of the n⁺ type are formed simultaneously by ion implantation using a different mask. When the source area 24 and the drain area 25 are formed, a region in which to form the back-gate area 26 is covered by the mask. Note that the source area 24 and the drain area 25 may be formed before forming the back-gate area 26.

Thereafter, an interlayer insulator 31, the contact electrodes 32, 34, 36, the source electrode 33, the drain electrode 35, and the like are formed as shown in FIGS. 2A and 2B.

Second Embodiment

Figure 6:
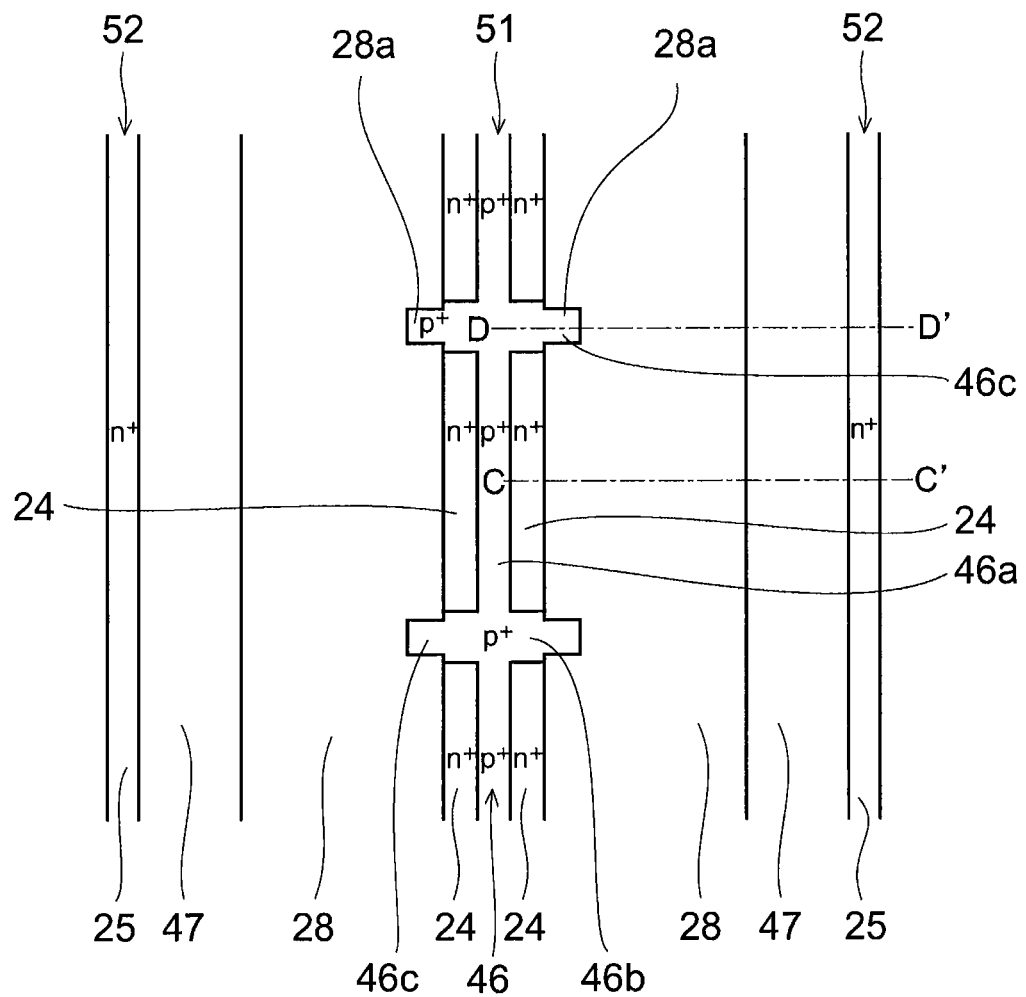
FIG. 6 is a schematic plan view showing a semiconductor device according to a second embodiment.

FIG. 6 is a schematic plan view showing a semiconductor device according to a second embodiment, and shows a plan layout having a drain area 25, a source area 24, a back-gate area 46, and a gate electrode 28.

Figure 7A:
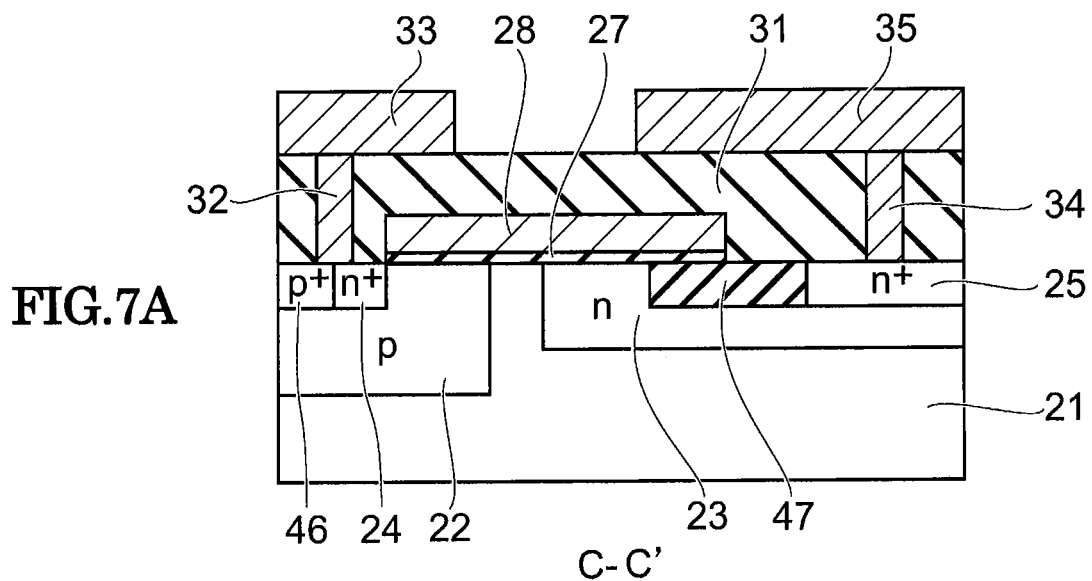
FIG. 7A is a cross-sectional view showing the semiconductor device taken along the C-C' line of FIG. 6.
Figure 7B:
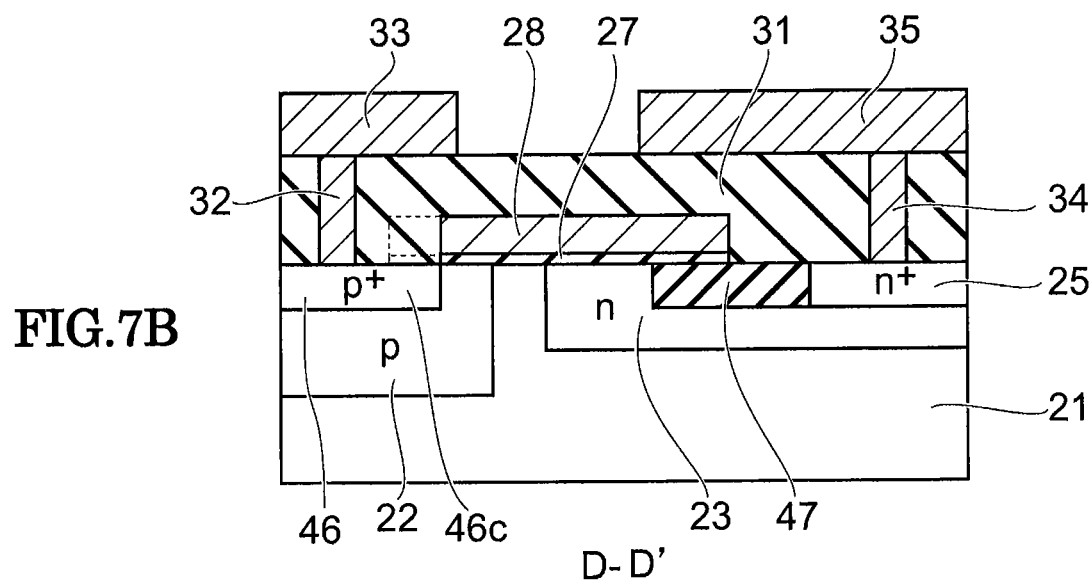
FIG. 7B is a cross-sectional view of the semiconductor device taken along the D-D' line of FIG. 6 according to the second embodiment.

FIG. 7A is a cross-sectional view showing the semiconductor device taken along the C-C' line of FIG. 6, and FIG. 7B is a cross-sectional view showing the semiconductor device taken along the D-D' line of FIG. 6.

As shown in FIGS. 7A and 7B, the semiconductor device of the second embodiment has a semiconductor layer including a p-type body area 22 and an n-type drift area 23. The body area 22 and the drift area 23 are provided on a top surface-side portion of a p-type substrate 21.

The n⁺-type source area 24 and the p⁺-type back-gate area 46 are provided on a top surface of the body area 22. The back-gate area 46 has a higher p-type impurity concentration than the body area 22. An n⁺-type drain area 25 is provided on a top surface of the drift 23 area.

Moreover, as shown in the plan view of FIG. 1, the semiconductor layer of the embodiment includes a first region 51 and a second region 52 which are isolated from each other with the gate electrode 28 interposed in between. The source area 24 and the back-gate area 46 are provided in the first region 51. The drain area 25 is provided in the second region 12.

The gate electrodes 28 is provided on a top surface of the semiconductor layer between the first region 51 and the second region 52 via a gate insulator 27 interposed in between.

The body area 22 and the drift area 23 exist below the gate electrode 28 via gate insulator 27 interposed in between. The p-type substrate 21 exists between the body area 22 and the drift area 23 below the gate electrode 28. Instead, the body area 22 and the drift area 23 may be contacted each other.

A field insulator 47 having a shallow trench isolation (STI) structure, for example, is provided on a top surface of the drift area 23. The field insulator 47 is contacted to a portion of the drain area 25 which is closer to the gate electrode 28.

As shown in FIG. 7A, the body area 22 exists between the source area 24 and the substrate 21. As shown in FIG. 7B, the body area 22 exists between the back-gate area 46 and the substrate 21.

The gate length direction is defined as a direction (horizontal direction in FIG. 6) in which the first region 51 and the second regions 52 are connected each other, and in which a main current flows while the gate is on, too, in the second embodiment. The gate width direction is defined as a direction (vertical direction in FIG. 6) which is orthogonal to the gate length direction.

As shown in FIG. 6, the back-gate area 46 has a region 46a which is interposed between the source area 24 and extends in the gate width direction, and a region 46b which intersect the region 46a and extend in the gate length direction. Moreover, each region 46b has protrusion areas 46c each of which protrudes toward the corresponding drain area 25 beyond the source area 24. In other words, an end of the back-gate area 46 which are closer to the drain area 25 are located closer to the drain area 25 than an end of the source area 24 which are closer to the drain area 25.

The gate electrode 28 has a planar pattern in which a portion of the gate electrode 28 is cut out above the protrusion area 46c of the back-gate area 46. In other words, the portion of the gate electrode 28 which are closer to the first region 51 are recessed with an opening like a concave shape directed toward the first region 51.

Each of the protrusion areas 46c of the back-gate area 46 is formed under recess portion 28a of the gate electrode 28. The length of a portion of the gate electrode 28 is shorter between the protrusion areas 46c of the back-gate 46 and the drain area 25 than between the source area 24 and the drain area 25.

As shown in FIGS. 7A and 7B, the interlayer insulator 31 is provided on the top surface of the semiconductor layer in which the semiconductor areas described above are formed, the interlayer insulator 31 covering the gate electrode 28. The source electrode 33 and the drain electrode 35 are provided on the top surface of the interlayer insulator 31. The source electrode 33 and the drain electrode 35 are dielectrically isolated from each other by an insulating layer, which is not illustrated.

The source contact electrode 32 which penetrates the interlayer insulator 31 and reaches the source area 24 and the back-gate area 46 is formed under the source electrode 33. The source electrode 33 is electrically connected to the source area 24 and the back-gate area 46 via the contact electrode 32.

Moreover, the contact electrode 34 which penetrates the interlayer insulator 31 and reaches the drain area 25 is formed under the drain electrode 35. The drain electrode 35 is electrically connected to the drain area 25 via the contact electrode 34.

When a desired gate potential is applied to the gate electrode 28 with relatively high and low potentials respectively applied to the drain electrode 35 and the source electrode 33, an inversion layer (n-channel) is formed in the top surface-side portion of the body area 22 and the p-type substrate 21 below the gate electrode 28. For example, a ground potential or a negative potential is applied to the source electrode 33, and a positive gate potential is applied to the gate electrode 28. A positive potential higher than the gate potential is applied to the drain electrode 35.

Accordingly, electric current flows between the source electrode 33 and the drain electrode 35 via the source area 24, the n-channel, the drift area 23, and the drain area 25, as well as the semiconductor device is turned on. A threshold voltage is adjusted by controlling the impurity concentration of the body area 22.

In addition, when the gate is off, the drift area 23 is depleted and an electric field is relaxed. Hence, a higher breakdown voltage is achieved. Moreover, since the high electric field occurring in an end portion in the drain side of the gate electrode 28 is received by the field insulator 47, the breakdown voltage is further improved.

Furthermore, the back-gate area 46 is provided in a way that a portion of the back-gate 46 protrudes toward the drain area 25 beyond the source area 24. In other words, the back-gate area 46 is closer to an avalanche breakdown point than the source area 24.

Thus, an avalanche current (hole current) is easy to flow to the source electrode 33 via the back-gate area 46. Hence, a base resistance of the parasitic bipolar transistor is reduced, and the parasitic bipolar transistor is less likely to turn on. As a result, the amount of the breakdown voltage is improved.

When the amount of breakdown voltage is improved, the area ratio of the back-gate area 46 can be reduced, and the element area can be reduced.

Next, a method of fabricating the semiconductor device of the second embodiment will be described with reference to FIGS. 8 to 11. Note that FIGS. 8 to 10 correspond to the D-D' cross section of FIG. 1.

Figure 8A:
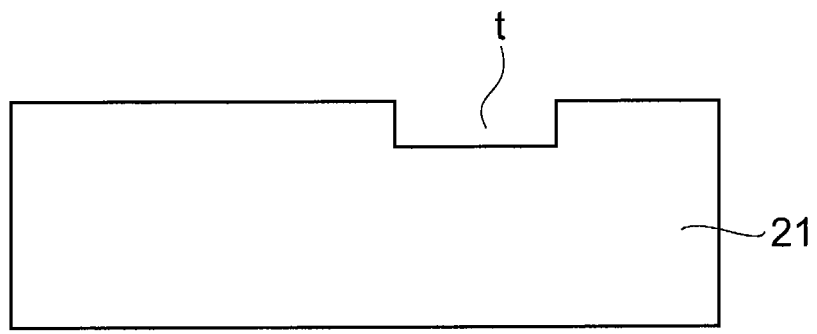
FIG. 8A and FIG. 8B are schematic cross-sectional views showing a method of fabricating the semiconductor device according to the second embodiment.
Figure 8B:
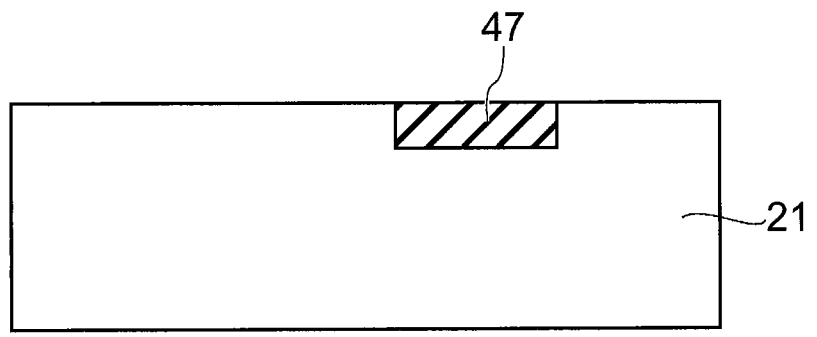

Firstly, as shown in FIG. 8A, a trench t is formed in a top surface of a substrate 21 by reactive ion etching (RIE), for example. Thereafter, as shown in FIG. 8B, insulating material (silicone oxide, for example) is embedded in the trench t. Thus, a field insulator 47 having the STI structure, for example, is formed.

Figure 9A:
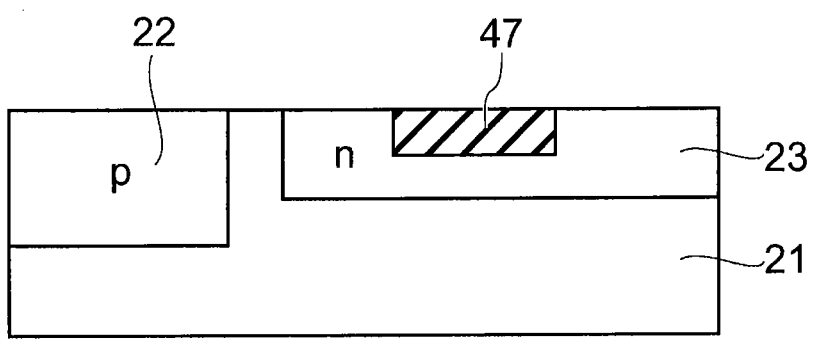
FIG. 9A and FIG. 9B are schematic cross-sectional views showing the method of fabricating the semiconductor device according to the second embodiment.

Next, a p-type impurity and an n-type impurity are implanted into the substrate 21 by ion implantation using a mask, for example, which is not illustrated. A heat treatment is performed after ion implantation, and thus a p-type body area 22 and the n-type drift area 23 are formed as shown in FIG. 9A.

Figure 9B:
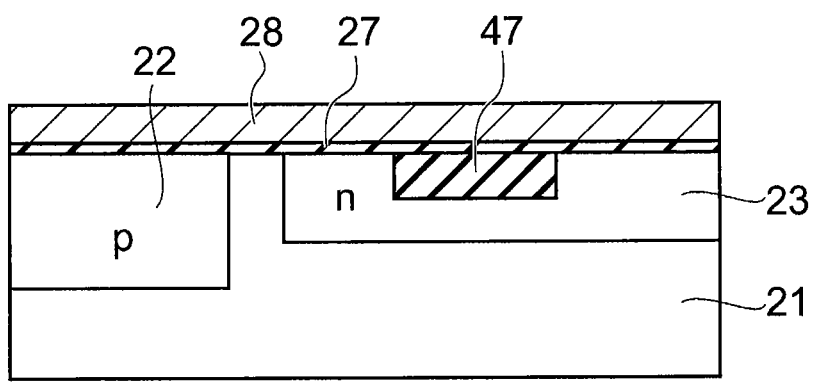
Figure 10A:
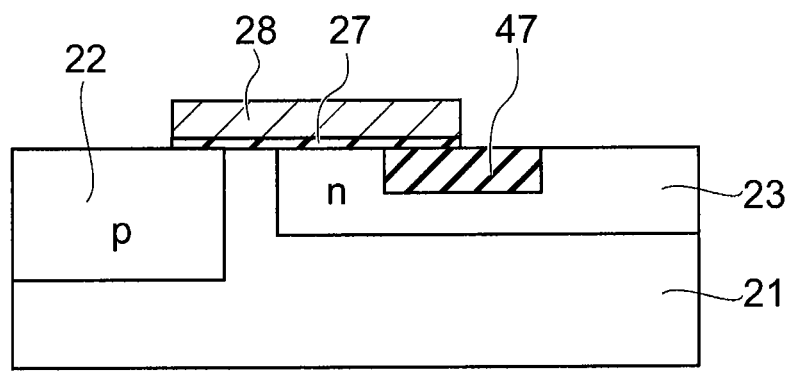
FIG. 10A and FIG. 10B are schematic cross-sectional views showing the method of fabricating the semiconductor device according to the second embodiment.

Next, as shown in FIG. 9B, the gate insulator 27 is formed on a top surface of a semiconductor layer including the body area 22 and the drift area 23, as well as on a top surface of the field insulator 47. The gate electrode 28 is formed on the gate insulator 27. Thereafter, the gate electrode 28 and the gate insulator 27 are patterned as shown in FIG. 10A.

The gate electrode 28 is patterned to have a planar shape partially having recess portions 28a, as shown in FIG. 6.

Figure 10B:
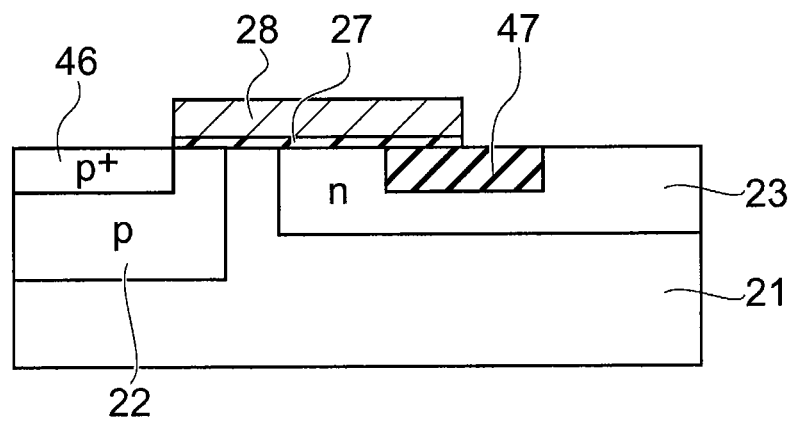

After the gate electrode 28 is patterned, a back-gate area 46 is formed on a top surface of the body area 22, as shown in FIG. 10B.

Figure 11:
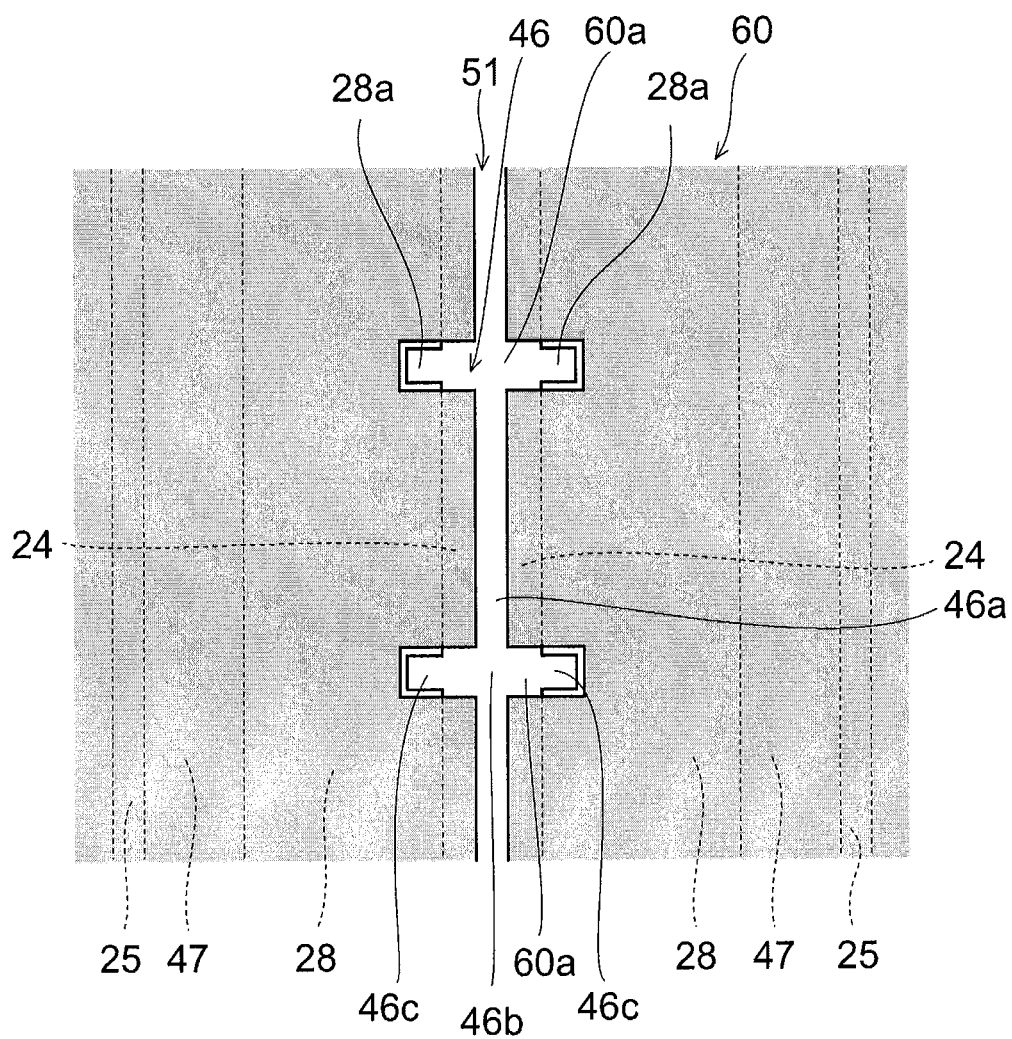
FIG. 11 is a schematic cross-sectional view showing the method of fabricating the semiconductor device according to the second embodiment.

For example, a p-type impurity is introduced by ion implantation using a mask 60 shown in FIG. 11. A mask opening 60a is formed in the mask 60. The recess portion 28a of the gate electrode 28 is exposed through the mask opening 60a. In addition, the portion of the first region 51 beside the recess portion 28a is also exposed through the mask opening 60a. Furthermore, a region, where the back-gate area 46 extending in the gate width direction is formed, is exposed through the mask opening 60a. The mask 60 covers a region where to form source area 24 and a region where to form drain area 25.

After the p-type impurity is implanted into the region exposed through the mask opening 60a, a heat treatment is performed. Thus, the back-gate area 46 including protrusion areas 46c protruding toward the drain area 25 is formed.

The protrusion area 46c of the back-gate 46 which protrudes toward the drain area 25 can be formed in a self-aligning manner by forming the recess portions 28a during the patterning of the gate electrodes 28, and then performing the ion implantation after the patterning of the gate electrodes 28.

The source area 24 and the drain area 25 which are both of the $n^+$-type are formed simultaneously by ion implantation using a different mask. When the source area 24 and the drain area 25 are formed, a region in which to form the back-gate area 46 is covered by the mask. Note that the source area 24 and the drain area 25 may be formed before forming the back-gate area 46.

Thereafter, the interlayer insulator 31, the contact electrodes 32, 34, the source electrode 33, the drain electrode 35, and the like are formed as shown in FIGS. 7A and 7B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a semiconductor layer comprising a first region and a second region isolated from the first region;
    a source area of a first conductivity type provided on a surface of the first region;
    a drain area of the first conductivity type provided on a surface of the second region;
    a back-gate area of a second conductivity type provided on the surface of the first region, the back-gate area having a first portion adjacent to the source area and a second portion spaced from the source area by the first portion, the second portion being at a distance from the drain area that is less than a distance between the source area and the drain area and less than a distance between the first portion and the drain area;
    a gate insulator on a surface of the semiconductor layer between the first region and the second region;
    a gate electrode on the gate insulator, a portion of the gate electrode on a side of the first region having a recessed portion above the second portion of the back-gate area.

2. The semiconductor device of claim 1, wherein the back-gate area connects to the source area electrically.

3. The semiconductor device of claim 1, wherein the gate electrode has a narrower width between the back-gate area and the drain area than between the source area and the drain area.

4. The semiconductor device of claim 1, wherein the back-gate area farther extends along a gate length direction than a gate width direction.

5. The semiconductor device of claim 1, further comprising:
    a body area of the second conductivity type provided on a surface of a third region located between the first region and the second region, the back-gate area being disposed inside the body area; and a drift area of the first conductivity type provided on the surface of the third region between the first region and the second region and contacting the body area, the drain area being disposed inside the drift area.

6. The semiconductor device of claim 1, further comprising:
an insulator embedded in a surface portion of the drift area and contacting the drain area.

7. The semiconductor device of claim 1, wherein
a portion of the back-gate area is formed to contact a side surface of the source area that is opposite to the gate electrode.

8. A semiconductor device, comprising:
a semiconductor layer comprising a first region and a second region isolated from the first region;
a source area of a first conductivity type provided on a surface of the first region;
a drain area of a first conductivity type provided on a surface of the second region;
a back-gate area of a second conductivity type provided on the surface of the first region, the back-gate area having a first area located adjacent to the source area and comprising a protruding area that is separated from the source area by the first area and extends towards the drain area such that a distance between the protruding area and the drain area is less than a distance between the first area and the drain area;
a gate insulator on a surface of the semiconductor layer between the first region and the second region; and
a gate electrode on the gate insulator, a portion of the gate electrode on a side of the first region having a recessed portion above the protruding area of the back-gate area.

9. The semiconductor device of claim 8, wherein
the back-gate area connects to the source area electrically.

10. The semiconductor device of claim 8, wherein
the gate electrode has a narrower width between the back-gate area and the drain area than between the source area and the drain area.

11. The semiconductor device of claim 8, wherein
the back-gate area extends farther along a gate length direction than a gate width direction.

12. The semiconductor device of claim 8, further comprising:
a body area of the second conductivity type provided on a surface of a third region located between the first region and the second region, the back-gate area being disposed inside the body area; and
a drift area of the first conductivity type provided on the surface of the third region between the first region and the second region and contacting the body area the drain area being disposed inside the drift area.

13. The semiconductor device of claim 8, further comprising:
an insulator embedded in a surface portion of the drift area and contacting the drain area.

14. The semiconductor device of claim 8, wherein
a portion of the back-gate area is formed to contact a side surface of the source area that is opposite to the gate electrode.

15. A method of fabricating a semiconductor device, comprising:
forming a gate insulator on a surface of a semiconductor layer between a first region and a second region;
forming a gate electrode on the gate insulator to have a recessed portion on a side of the first region;
forming a source area of a first conductivity type on a surface of the first region, and a drain area of the first conductivity type on a surface of the second region; and
forming a back-gate area of a second conductivity type on the surface of the first region, the back-gate area having, a first area adjacent to the source area and a protruding area that is separated from the source area by the first area, the protruding area extending towards the drain area such that a distance between the protruding area and the drain area is less than a distance between the first area and the drain area,
wherein the forming of the back-gate area comprises forming a first mask on the gate electrode, the first mask covering the source region and having an opening to expose the recessed portion of the gate electrode, and introducing impurities of the second conductivity type into the first region using the first mask and the gate electrode as masks.

16. The method of claim 15, further comprising:
connecting the source area to the back gate area electrically.

17. The method of claim 15, wherein
an insulator is embedded into the surface between the first region and the second region before forming the gate insulator.

18. The method of claim 15, wherein
the back-gate is formed to contact a side surface of the source area that is opposite to the gate electrode.

* * * * *